(12) United States Patent
Chau et al.

(10) Patent No.: US 8,397,785 B2
(45) Date of Patent: Mar. 19, 2013

(54) TRANSFER APPARATUS FOR MULTIPLE ADHESIVES

(75) Inventors: Keung Chau, Kwai Chung (HK); Wing Fai Lam, Kwai Chung (HK); Man Chung Ng, Kwai Chung (HK)

(73) Assignee: ASM Assembly Automation Ltd, Hong Kong (HK)

( * ) Notice: Subject to any disclaimer, the term of this patent is extended or adjusted under 35 U.S.C. 154(b) by 370 days.

(21) Appl. No.: 12/619,793

(22) Filed: Nov. 17, 2009

(65) Prior Publication Data
US 2011/0114258 A1 May 19, 2011

(51) Int. Cl.
*B65C 9/22* (2006.01)
*B05C 1/02* (2006.01)

(52) U.S. Cl. .................. 156/578; 156/306.6; 118/243; 118/263

(58) Field of Classification Search .................. 118/243, 118/263; 425/385, 447, 340, 343; 156/578, 156/306.1, 306.6; 29/840
See application file for complete search history.

(56) References Cited

U.S. PATENT DOCUMENTS

| | | | |
|---|---|---|---|
| 5,065,674 A * | 11/1991 | Kobayashi et al. | 101/44 |
| 5,186,982 A * | 2/1993 | Blette et al. | 427/98.4 |
| 6,024,925 A * | 2/2000 | Little et al. | 422/507 |
| 7,118,628 B2 * | 10/2006 | Taiana et al. | 118/58 |
| 2007/0280516 A1 * | 12/2007 | Yoneyama et al. | 382/126 |

* cited by examiner

*Primary Examiner* — Laura Edwards
(74) *Attorney, Agent, or Firm* — Ostrolenk Faber LLP

(57) ABSTRACT

Multiple types of adhesives contained in separate containers are transferred from a supply of adhesives to a substrate. A first stamping pin is moved to a position of a first container containing a first adhesive, and the first adhesive is transferred with the first stamping pin from the first container to the substrate before bonding a first die onto the first adhesive. A second stamping pin is then moved to a position of a second container containing a second adhesive, and the second adhesive is transferred with the second stamping pin from the second container to the substrate before bonding a second die onto the second adhesive.

9 Claims, 4 Drawing Sheets

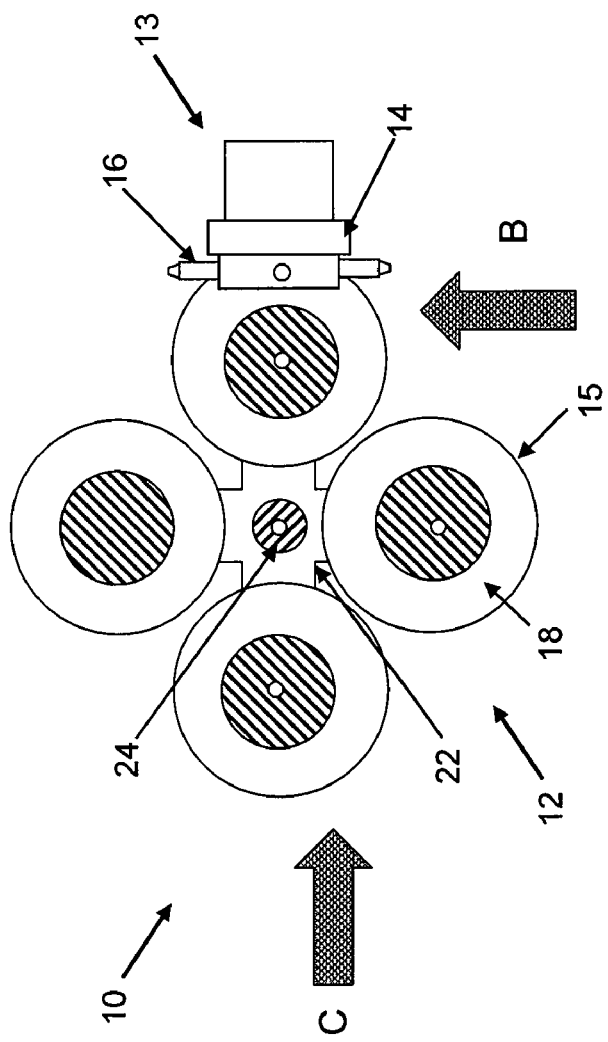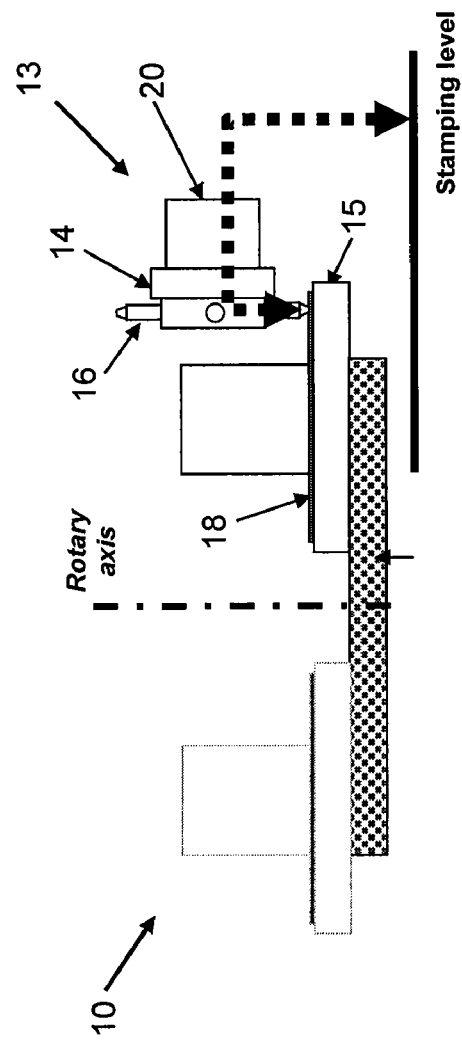
FIG. 3
FIG. 4

TRANSFER APPARATUS FOR MULTIPLE ADHESIVES

FIELD OF THE INVENTION

The invention relates to the bonding of electronic devices, and in particular to adhesive dispensers using pins or stamps for printing viscous or paste-like liquid such as epoxy used in the bonding of electronic devices.

BACKGROUND AND PRIOR ART

Die-bonding is an important process in the packaging of integrated circuit packages. In the die-bonding process, dice that are cut from a wafer are taken out and bonded onto a substrate such as a lead frame for follow-up processes such as wire bonding and molding. Prior to bonding a die to a substrate, a paste-dispensing mechanism dispenses an adhesive agent onto the substrate. Then, a die pick-and-place mechanism of the die bonder places a die onto the substrate at the position where the adhesive agent has been dispensed. Finally, a heater is used to cure the adhesive agent so as to bond the die to the substrate.

In the electronics industry, various methods of dispensing adhesive agents have evolved to keep up with the rapid development of manufacturing needs for adhesives and conductive epoxies in a wide array of packaging assemblies. Dispensing applications have also expanded to other areas needed for new types of packaging encapsulation techniques. A wide variety of fluid materials with different viscosities are being used as adhesives, from solder paste, conductive adhesives and damming compound to fluxes, thermal paste and underfills. Various methods of dispensing are available such as stamping, stencil printing, jet-dispensing and nozzle or needle dispensing.

Stamping, which is also known as daubing or pin transfer, involves dipping a compliant tool into a reservoir of liquid adhesive and then transferring the liquid adhesive adhering to the tool onto a substrate such as a lead frame. This method is frequently used to attain very small dots or patterns of adhesive on the substrate, or when an adhesive is not suitable for dispensing through dispenser nozzles. A stamping system is illustrated in FIGS. 1 and 2 which show isometric and side views respectively of a conventional adhesive stamping system 100. The stamping system 100 comprises an adhesive disc 102 having a reservoir which holds an adhesive material 104, and a stamping pin 106 affixed to a stamping arm 108 which is designed to dip the stamping pin 106 into the adhesive material 104 and to transfer the adhesive material 104 on the stamping pin 106 onto a substrate placed at a stamping level.

Different types of adhesives may be required for bonding different dice onto a substrate. For instance, non-conductive adhesive may be used to bond blue and green light emitting diode (LED) dice while silver epoxy may be applied for bonding red LED dice. When a different adhesive is required, the adhesive disc 102 and the stamping pin 106 would have to be replaced accordingly to cater for the different adhesive. If the same stamping pin 106 and adhesive disc 102 are used for different adhesives, then the stamping pin 106 and the adhesive disc 102 have to be removed for cleaning before they used to transfer a different adhesive. This results in machine idle time and lengthens the operation process. Alternatively, to avoid having to remove or change any stamping pin and adhesive disc, each machine may be designated for handling one type of die or the same range of dice using the same type of adhesive. This results in increased costs due to duplication.

Therefore, it would be desirable to provide a stamping system which allows the use of different adhesives while avoiding excessive machine idle time or duplicity.

SUMMARY OF THE INVENTION

It is thus an object of this invention to seek to provide a stamping system which is capable of applying different types of adhesives successively onto a substrate when multiple adhesives are in use.

According to a first aspect of the invention, there is provided a method for transferring multiple types of adhesives from a supply of adhesives to a substrate, comprising the steps of: moving a first stamping pin to a position of a first container containing a first adhesive; transferring the first adhesive with the first stamping pin from the first container to the substrate; bonding a first die onto the first adhesive; moving a second stamping pin to a position of a second container containing a second adhesive; transferring the second adhesive with the second stamping pin from the second container to the substrate; and bonding a second die onto the second adhesive According to a second aspect of the invention, there is provided an apparatus for transferring multiple types of adhesives from a supply of adhesives to a substrate for bonding a die onto the substrate, comprising: multiple containers for the adhesives, wherein a separate container is provided for each type of adhesive; and multiple stamping pins for transferring the adhesives from the container to the substrate, wherein each stamping pin is operative to transfer a different type of adhesive to the substrate It would be convenient hereinafter to describe the invention in greater detail by reference to the accompanying drawings which illustrate the preferred embodiment of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiment of the invention when considered with the accompanying drawings, in which:

FIG. 3 is a top view of a stamping system for adhesives according to the preferred embodiment of the present invention;

FIG. 4 is a side view of the stamping system viewed from direction B of FIG. 3;

DETAILED DESCRIPTION OF THE PREFERRED EMBODIMENT OF THE INVENTION

Figure 1:
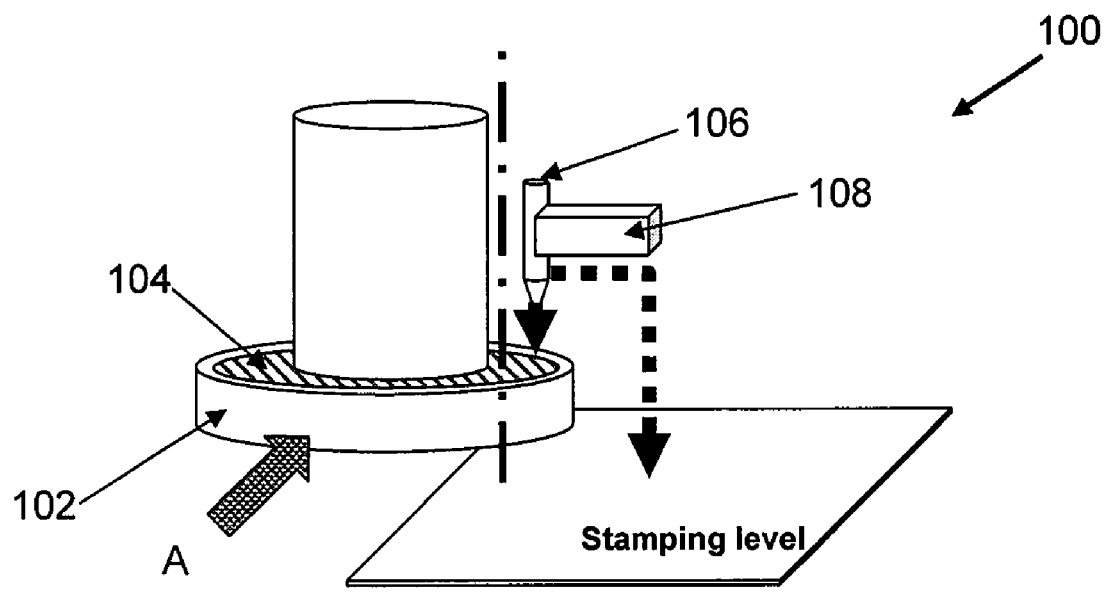
FIG. 1 is an isometric view of a conventional adhesive stamping system.
Figure 2:
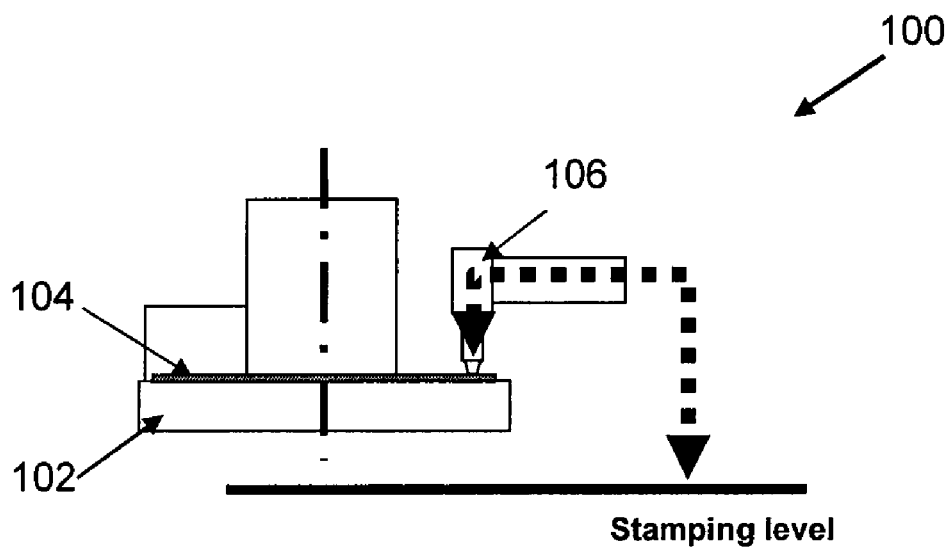
FIG. 2 is a side view of the conventional adhesive stamping system viewed from direction A of FIG. 1.

The preferred embodiment of the present invention will be described hereinafter with reference to the accompanying drawings.

FIGS. 3 and 4 are top and side views respectively of a stamping system 10 for adhesives according to the preferred embodiment of the present invention. The stamping system 10 consists of a rotary platform 12 including a plurality of adhesive discs 15 and a multiple stamping pin assembly 13. The rotary platform 12 is mounted radially on a disc support 22 and is rotatable about an axle 24.

The multiple stamping pin assembly 13 comprises a rotary stamping pin holder 14 which is positionable adjacent to the rotary platform 12 and supports a plurality of stamping pins 16. The number of stamping pins 16 preferably corresponds to the number of adhesive discs 15 comprised in the rotary platform 12. Each adhesive disc may contain a different type of adhesive 18 and each stamping pin 16 may be used for dipping into one type of adhesive 18 only.

When a particular type of adhesive 18 is required, the adhesive disc 15 containing the required adhesive 18 is rotated to a pick-up position. A stamping pin 16 on the stamping pin holder 14 pre-selected for transferring the said adhesive 18 is rotated such that it is positioned at the pick-up position for picking up and transferring the adhesive 18 to a substrate located at a stamping level. Both the adhesive disc 15 and the stamping pin 16 may also move in a translational manner to the pick-up position. Otherwise, the adhesive discs 15 may be in fixed positions while the stamping pin 16 picks up epoxy at the different fixed positions of the adhesive discs 15. In another possible embodiment, the multiple stamping pins 16 may be arranged in one or more rows on a linear movable arm above the rotary platform 12 or the adhesive discs 15 may be mounted in a row. The selected stamping pin 16 on the linear movable arm can thus be positioned above the desired adhesive disc 15 to transfer the adhesive 18.

Figure 5A:
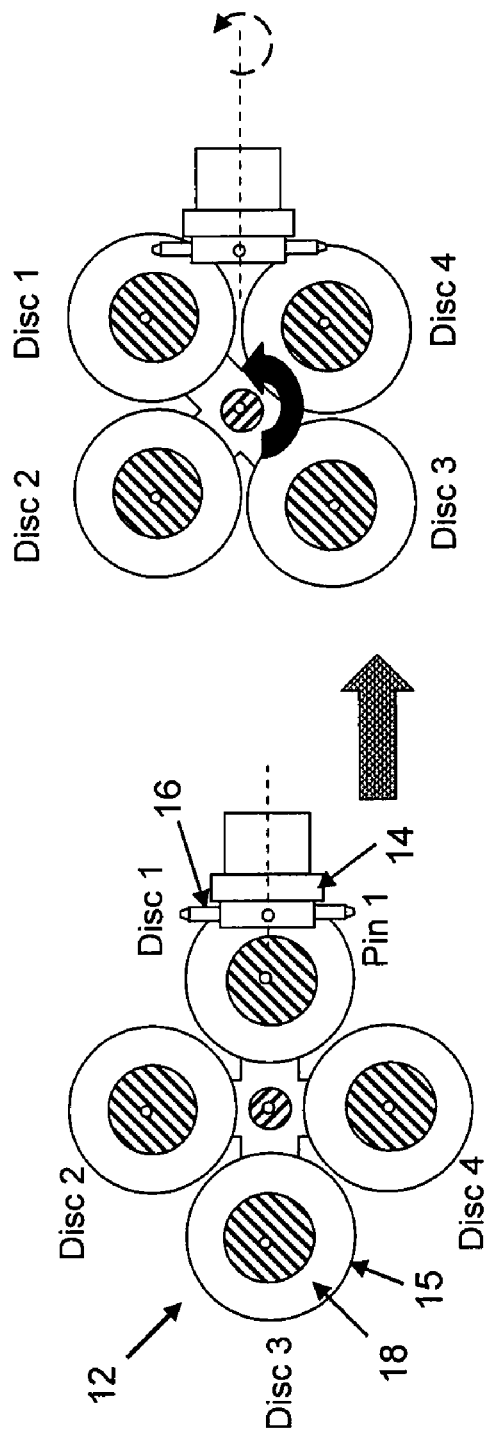
FIGS. 5A-5C are top views of the stamping system of FIG. 3 illustrating the movement of a selected adhesive disc to a pick-up position.
Figure 5B:
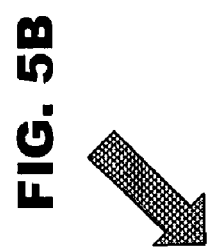
Figure 5C:
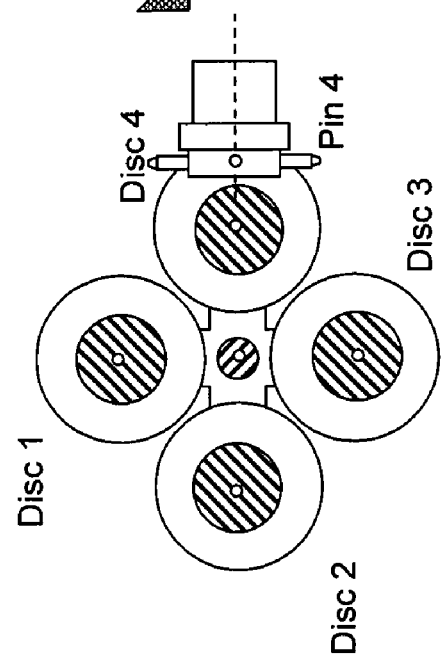

FIGS. 5A-5C are top views of the stamping system 10 of FIG. 3 illustrating the movement of a selected adhesive disc 15 to the pick-up position. FIG. 5A shows adhesive discs 1, 2, 3 and 4 arranged with adhesive disc 1 at the pick-up position. One of the stamping pins 16 mounted on the stamping pin holder 14 is positioned over adhesive disc 1 for dipping the stamping pin 16 into the adhesive 18 in adhesive disc 1 and then transferring the adhesive 18 to a substrate. A die is then bonded onto the adhesive on the substrate. When different dice are to be placed on the substrate, a different adhesive may be required for attaching the different dice to the substrate. FIG. 5B illustrates the adhesive discs 1, 2, 3, 4 being rotated anti-clockwise about the axle 24 until adhesive disc 4 is rotated to the pick-up position as shown in FIG. 5C. At the same time, the stamping pin 16 on the stamping pin holder 14 which is selected for use with the required adhesive 18 is rotated to above the pick-up position and is ready for transferring the required adhesive 18 to a substrate. The second stamping pin 16 transfers the required adhesive 18 to the substrate and a second die is then bonded onto the adhesive on the substrate. In this way, when a different adhesive is required for bonding a die to a substrate, it is not necessary to physically disassemble or replace the adhesive disc in use, and correspondingly, it is also not necessary to replace or clean a stamping pin 16 for use with a different adhesive.

Figure 6:
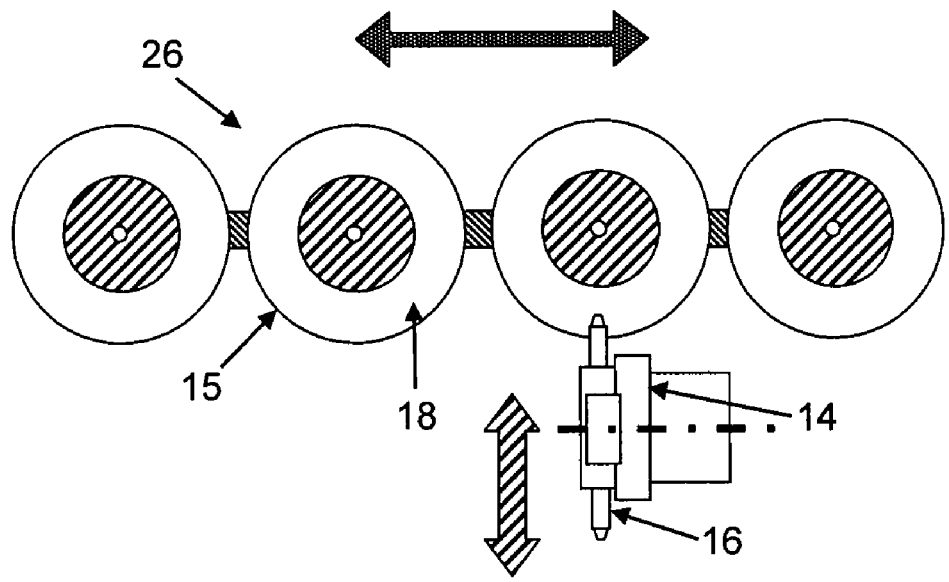
FIG. 6 is a top view of a stamping system according to another preferred embodiment of the invention.

FIG. 6 is a top view of a stamping system according to another preferred embodiment of the invention. In this embodiment, the adhesive discs 15 are arranged in a row, and they may be mounted onto a linearly-driven conveyor mechanism 26. If so, the row of adhesive discs 15 carrying adhesive 18 is movable along a first linear axis by the conveyor mechanism 26, and the stamping pin holder 14 is movable along a second linear axis which is perpendicular to the first linear axis. Alternatively, the stamping pin holder 14 may be movable along the first and second perpendicular axes on a horizontal plane in order to position each stamping pin 16 over a selected adhesive disc for dipping the stamping pin 16 into the selected adhesive 18. In this case, the adhesive discs 15 can be stationary and need not be movable.

Figure 7:
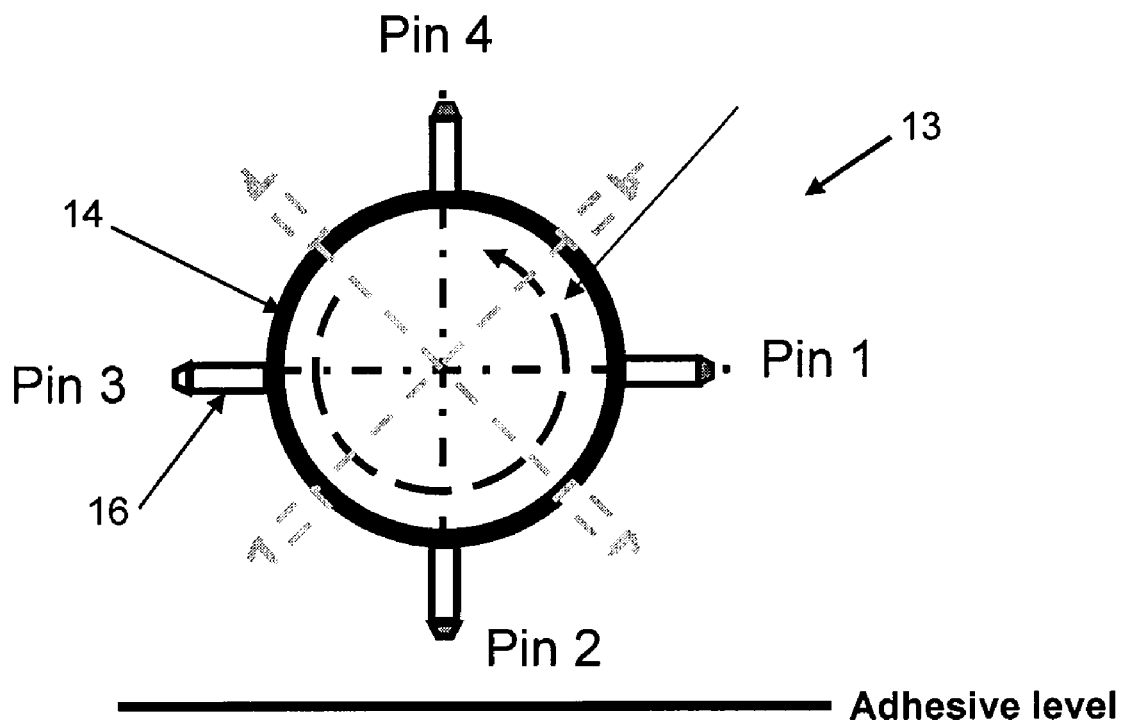
FIG. 7 is a side view of a multiple stamping pin assembly of the stamping system viewed from direction C of FIG. 3.

FIG. 7 is a side view of a multiple stamping pin assembly 13 of the stamping system 10 viewed from direction C of FIG. 3. The multiple stamping pins assembly 13 comprises a rotary stamping pin holder 14 to which multiple stamping pins 16 are mounted. Generally, the number of stamping pins 16 should be at least the same as the number of adhesive discs 15 on the stamping system 10. Four stamping pins 16 are shown in FIG. 7 corresponding to the four adhesive discs 15 illustrated in the preferred embodiment. A selected stamping pin 16 for transferring an adhesive 18 is rotated to the pick-up position for each transfer operation as described above. In this way, one stamping pin 16 may be used for transferring one type of adhesive 18, and it is not necessary to clean the stamping pin 16 for using it with another type of adhesive 18.

It should be appreciated that the use of the stamping system 10 for adhesives which includes the multiple stamping pin assembly 13 according to the preferred embodiments of the invention permit efficient high-volume die bonding when a mixed production involving more than one adhesive for more than one type of die is required. Interchanging either the adhesive disc 12 or the stamping pin 16 can also be automated using the above-described stamping system to hasten the process further. Machine idle time is much reduced as it is not necessary to stop the die bonder to disassemble and replace an adhesive disc 12 or a stamping pin 16 with another one. When multiple wafer loaders are in use, multiple dice can be bonded with different adhesives in a single pass. It is also not necessary to dedicate a single die bonder for use with only one adhesive to avoid having to wash, remove or replace any adhesive disc 12 or a stamping pin 16. Hence, multiple die bonders are not required when bonding different dice to a substrate. Moreover, flexibility can be achieved since more than one adhesive may be used with one die bonder using the stamping system 10.

The invention described herein is susceptible to variations, modifications and/or additions other than those specifically described and it is to be understood that the invention includes all such variations, modifications and/or additions which fall within the spirit and scope of the above description.

The invention claimed is:

1. An apparatus for transferring multiple types of adhesives from a supply of adhesives to a substrate for bonding dies onto the substrate, the apparatus comprising:
   a support structure;
   multiple containers mounted onto the support structure, the multiple containers being configured to contain the adhesives, wherein a separate container is provided for each type of adhesive;
   a stamping pin holder; and
   multiple stamping pins mounted to the stamping pin holder,
   wherein the support structure is operable to move and position each of the multiple containers with respect to the stamping pin holder and to a pick-up position, and the stamping pin holder is configured to move relative to the multiple containers to position each of the multiple stamping pins to the pick-up position so as to dip each stamping pin into a selected type of adhesive in a respective container, thereby to transfer the selected type of adhesive from the respective container to the substrate.

2. An apparatus as claimed in claim 1, wherein the stamping pin holder is a rotary stamping pin holder, and wherein the stamping pins are arranged radially on the rotary stamping pin holder.

3. An apparatus as claimed in claim 1, wherein the total number of stamping pins is equal to the total number of containers.

4. An apparatus as claimed in claim 1, wherein the support structure comprises a rotary platform rotatable about an axle on which the multiple containers are mounted.

5. An apparatus as claimed in claim 1,
wherein the containers are arranged in a row and are movable linearly to the pick-up position for a stamping pin to be dipped into each container.

6. An apparatus as claimed in claim 1, wherein the support structure comprises a conveyor mechanism to move each container to the pick-up position.

7. An apparatus as claimed in claim 1,
wherein each container comprises an adhesive disc.

8. The apparatus as claimed in claim 1, wherein the stamping pins are mounted on a moveable arm which is configured to move linearly to the pick-up position.

9. An apparatus as claimed in claim 8, wherein the movable arm is linearly movable along two perpendicular axes on a horizontal plane.

\* \* \* \* \*